(12) United States Patent
Shibata

(10) Patent No.: US 7,674,699 B2
(45) Date of Patent: Mar. 9, 2010

(54) III GROUP NITRIDE SEMICONDUCTOR SUBSTRATE, SUBSTRATE FOR GROUP III NITRIDE SEMICONDUCTOR DEVICE, AND FABRICATION METHODS THEREOF

(75) Inventor: Masatomo Shibata, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 648 days.

(21) Appl. No.: 11/431,106

(22) Filed: May 10, 2006

(65) Prior Publication Data

US 2006/0270200 A1 Nov. 30, 2006

(51) Int. Cl.
*H01L 21/28* (2006.01)
*H01L 21/20* (2006.01)

(52) U.S. Cl. .................. 438/602; 438/478; 438/481; 438/604

(58) Field of Classification Search ................ 438/478, 438/481, 602, 604; 257/E21.113, E21.121, 257/E21.125, E21.127, E21.131, E21.132
See application file for complete search history.

(56) References Cited

U.S. PATENT DOCUMENTS

| | | | |
|---|---|---|---|
| 6,100,545 | A | 8/2000 | Chiyo et al. |
| 6,218,207 | B1 | 4/2001 | Itoh et al. |
| 6,368,733 | B1 | 4/2002 | Nishinaga |
| 6,413,627 | B1 | 7/2002 | Motoki et al. |
| 6,426,512 | B1 | 7/2002 | Ito et al. |
| 6,812,051 | B2 | 11/2004 | Usui et al. |
| 6,924,159 | B2 | 8/2005 | Usui et al. |
| 7,189,588 | B2 | 3/2007 | Usui et al. |
| 7,485,484 | B2 | 2/2009 | Nakahata et al. |
| 2005/0227472 | A1* | 10/2005 | Nakahata et al. ............ 438/602 |
| 2006/0046325 | A1 | 3/2006 | Usui et al. |

FOREIGN PATENT DOCUMENTS

| | | |
|---|---|---|
| EP | 1 271 627 A2 | 1/2003 |
| JP | 63-188983 A | 8/1988 |
| JP | 11-195814 A | 7/1999 |
| JP | 2000-012900 A | 1/2000 |
| JP | 2000-022212 A | 1/2000 |
| JP | 2000-049092 A | 2/2000 |
| JP | 2000-114178 A | 4/2000 |
| JP | 2000-252217 A | 9/2000 |
| JP | 2000-323753 A | 11/2000 |
| JP | 2002-343728 A | 11/2002 |
| JP | 2003-178984 A | 6/2003 |
| JP | 2004-039810 A | 2/2004 |
| JP | 2004-331453 A | 11/2004 |

OTHER PUBLICATIONS

L. Bachmann et al., "Observations on the Morphological Changes in Thin Copper Deposits during Annealing and Oxidation," Journal of Applied Physics, vol. 36, No. 1, Jan. 1965, pp. 304-308.

(Continued)

*Primary Examiner*—Hung Vu
(74) *Attorney, Agent, or Firm*—Foley & Lardner LLP

(57) ABSTRACT

A III group nitride semiconductor substrate according to the present invention is fabricated by forming a metal film or metal nitride film 2' with mesh structure in which micro voids are provided on a starting substrate 1, and growing a III group nitride semiconductor crystal layer 3 via the metal film or metal nitride film 2'.

2 Claims, 5 Drawing Sheets

OTHER PUBLICATIONS

M.L. Gimpl et al., "Amorphous Oxide Layers on Gold and Nickel Films Observed by Electron Microscopy," Journal of Applied Physics, vol. 35, No. 12, Dec. 1964, pp. 3572-3575.

O. Nam et al., "Lateral epitaxy of low defect density GaN layers via organometallic vapor phase epitaxy," Appl. Phys. Lett., vol. 71, No. 18, Nov. 3, 1997, pp. 2638-2640.

T.S. Zheleva et al., "Pendeo-Epitaxy—A New Approach for Lateral Growth of Gallium Nitride Structures," MRS Internet J. Nitride Semicond. Res. 1999, 4S1, G3, 38, 6 pgs.

M. Kuramoto et al., "Room-Temperature Continuous-Wave Operation of InGaN Multi-Quantum-Well Laser Diodes Grown on an n-GaN Substrate with a Backside n-Contact," Jpn. J. Appl. Phys., vol. 38, No. 2B, (1999) Pt. 2, pp. L184-L186.

* cited by examiner

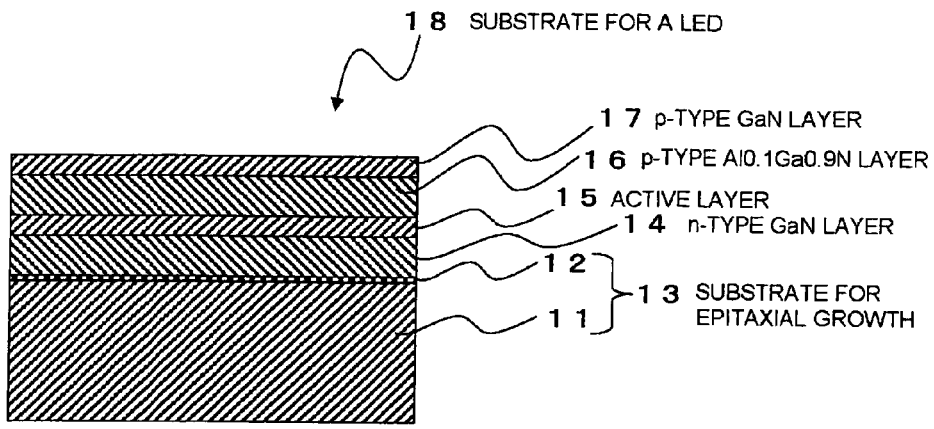

- 18 SUBSTRATE FOR A LED
- 17 p-TYPE GaN LAYER
- 16 p-TYPE Al0.1Ga0.9N LAYER
- 15 ACTIVE LAYER
- 14 n-TYPE GaN LAYER
- 12
- 13 SUBSTRATE FOR EPITAXIAL GROWTH
- 11

11 SAPPHIRE SUBSTRATE
12 METAL FILM OR METAL NITRIDE FILM WITH MESH STRUCTURE

FIG. 8

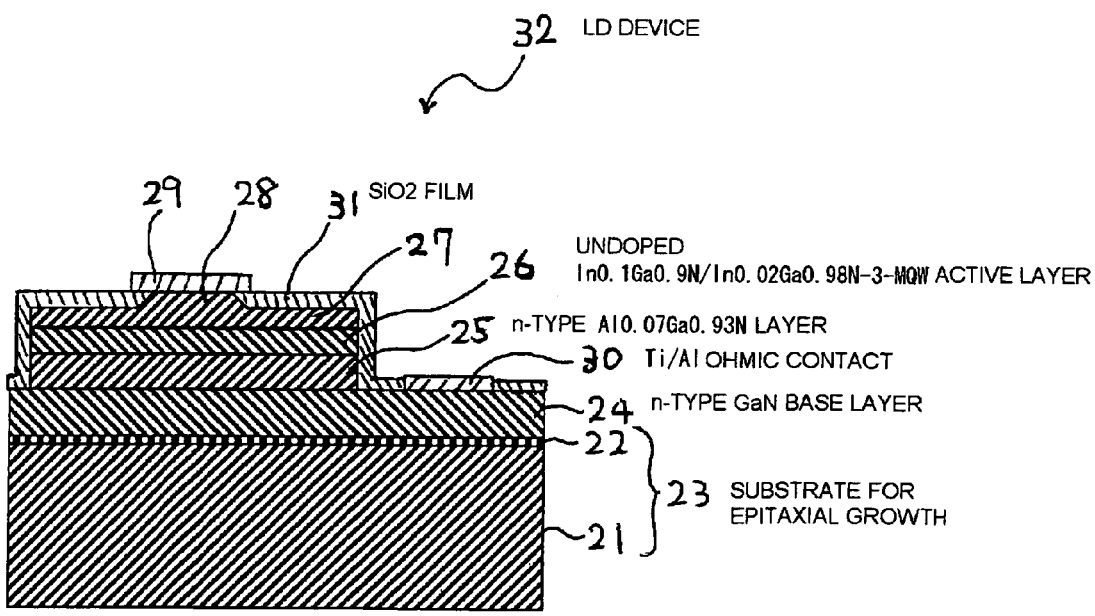

- 32 LD DEVICE
- 31 SiO2 FILM
- 26 UNDOPED In0.1Ga0.9N/In0.02Ga0.98N-3-MQW ACTIVE LAYER
- 25 n-TYPE Al0.07Ga0.93N LAYER
- 30 Ti/Al OHMIC CONTACT
- 24 n-TYPE GaN BASE LAYER
- 22
- 23 SUBSTRATE FOR EPITAXIAL GROWTH
- 21

27 p-TYPE Al0.07Ga0.93N LAYER
28 NARROW STRIPE-SHAPED WAVEGUIDE FOR A SEMICONDUCTOR LASER
29 Ni/Au OHMIC CONTACT

21 SAPPHIRE SUBSTRATE
22 METAL FILM OR METAL NITRIDE FILM WITH MESH STRUCTURE

III GROUP NITRIDE SEMICONDUCTOR SUBSTRATE, SUBSTRATE FOR GROUP III NITRIDE SEMICONDUCTOR DEVICE, AND FABRICATION METHODS THEREOF

This application is based on Japanese patent application No. 2003-358350, and a whole content of this Japanese application is referred and introduced in this application.

BACKGROUND OF THE INVENTION

1. Field of the Invention

The invention relates to a III group nitride semiconductor substrate, a substrate for a III group nitride semiconductor device and fabrication methods thereof.

2. Description of the Related Art

A GaN-based compound semiconductor such as gallium nitride (GaN), indium gallium nitride (InGaN), and aluminum gallium nitride (AlGaN) comes into the limelight as a material for a blue light emitting diode (LED) and a laser diode (LD). In addition, with making use of features such as heat resistance, environment characteristics resistance of the GaN-based compound semiconductor, the application development of an element for an electronic device using the GaN-based compound semiconductor begins.

In general terms, as a method for fabricating a GaN-based compound semiconductor device, a method for epitaxially growing a GaN-based crystal on a sapphire substrate is used. However, a single crystal film of GaN cannot be directly grown on the sapphire substrate, since the sapphire substrate is different in lattice constant from GaN. So as to solve this problem, a method of growing a buffer layer of AlN or GaN at a low-temperature of around 500° C. on a sapphire substrate once, relaxing a lattice strain by the low-temperature growth buffer layer, and growing GaN thereon at a high temperature of around 1000° C., is invented and placed in practical use broadly (For example, Japanese Patent Laid-Open No. 63-188983 (Patent document 1)). The single crystal epitaxial growth of GaN can be achieved by using the low-temperature growth nitride layer as the buffer layer.

However, in this technique, the crystallinity of the GaN crystal grown at a high temperature is sensitive to the thickness and the crystallinity of the low-temperature growth buffer layer, so that it is difficult to grow the GaN crystal with a good repeatability. In addition, since a growth temperature must be varied in the crystal growth, there are disadvantages in that the increase/decrease and stabilization of the temperature take a longer time and so on. Further, the epitaxial growth of the GaN single crystal on the sapphire substrate can be realized by using the low-temperature growth buffer layer, however, it is assumed that innumerable defects occurring in the GaN due to the lattice-mismatch between the substrate and the crystal become the obstacle in fabricating a GaN-based LD.

In recent years, some techniques for reducing the crystal dislocation density due to the difference in lattice constant between the sapphire and the GaN were reported, for example, an ELO (Epitaxial Lateral Overgrowth) method (Appl. Phys. Lett. 1997, Vol. 71, No. 18, p. 2638), and FIELO (Facet-Initiated Epitaxial Lateral Overgrowth) method (Jpn. J. Appl. Phys. 1999, Vol. 38, p. L184), as well as a Pendio-epitaxy (MRS Internet J. Nitride Semicond. Res. 1999, 4S1, G3, 38), and GaN epitaxial wafers with significantly improved crystallinity can be obtained. However, as for the ELO method, etc., there is a disadvantage in that complicated process such as photolithography process, etching process is required. Further, according to these methods, there is a disadvantage in that the dislocation distribution in the GaN becomes heterogeneous unless a GaN thick film having a thickness more than dozens of micrometers is grown.

In recent years, techniques of growing a GaN thick film on a substrate by HVPE (Hydride Vapor Phase Epitaxy) method and cutting out a self-standing substrate of GaN are disclosed (Japanese Patent Laid-Open No. 2000-012900, Japanese Patent Laid-Open No. 2000-022212, Japanese Patent Laid-Open No. 2000-252217 (patent documents 2 to 4), etc.). In these techniques, a technique for fabricating a GaN substrate once and growing a GaN crystal ingot by using this as a seed crystal thereafter is adopted, however, so as to simplify the process and to reduce the manufacturing cost of the GaN substrate, a technique for conducting a hetero epitaxial growth of a GaN thick film on a foreign substrate such as sapphire substrate and cutting out a self-standing substrate of the GaN directly therefrom is desirable. However, according to a conventional growth method using the low-temperature growth buffer layer, the relaxation of the strain due to the difference in lattice constant between the starting substrate and the GaN is not enough, therefore, for example, when growing the GaN on the sapphire substrate to have a thickness of about 100 μm, the GaN is naturally cracked during the growth, so that it is difficult to grow the GaN to have an enough thickness to cut out a self-standing substrate therefrom.

It has been known for a long time that micro voids are formed to have a mesh structure when a thin metal film is heated. For example, it is reported that micro voids with mesh structure are formed in a thin film of nickel, gold, copper, etc. by heating in M. L. Gimpl, A. D. McMaster, and N. Fuschillo, J. Appl. Phys. 1964, Vol. 35, p. 3572 (non-patent document 1) and L. Bachmann, D. L. Sawner, and B. M. Siegel, J. Appl. Phys. 1965, Vol. 36, p. 304 (non-patent document 2). Such mesh structure is conspicuously observed particularly in a film formed by the vacuum deposition method. However, a technique for conducting a crystal growth of a III group nitride semiconductor via a film with mesh structure thus obtained is not known.

Techniques for growing a III group nitride semiconductor crystal via titanium metal, titanium nitride, zirconium nitride, or hafnium nitride are disclosed in Japanese Patent Laid-open No. 11-195814, Japanese Patent Laid-Open No. 2000-049092, and Japanese Patent Laid-Open No. 2000-323753 (patent documents 5 to 7), and it is disclosed that the GaN crystal growth is possible even if the low-temperature growth buffer layer is not provided, in the Japanese Patent Laid-Open No. 2000-323753 (patent document 8). However, it is specified that it is preferable that the low-temperature growth buffer layer intervenes and it is difficult to obtain a high quality GaN crystal by the epitaxial growth, when only the titanium nitride, etc. intervenes.

Technique for growing III group nitride semiconductor crystal by providing a mask of high melting thin metal film is disclosed in Japanese Patent Laid-Open No. 2000-114178 (patent document 9). However, this mask is fabricated by making full use of the photolithography method, and an aperture width of a window in a mask is limited to several micrometers due to restrictions imposed by processing accuracy. In the case of growing the III group nitride semiconductor crystal by means of this mask, a number of crystal growth nucleuses are generated from inside the windows in the mask, and effect for reducing the crystal dislocation can be obtained, however, the insertion of the low-temperature buffer layer becomes indispensable.

[Patent document 1] Japanese Patent Laid-Open No. 63-188983 bulletin

[Patent document 2] Japanese Patent Laid-Open No. 2000-012900 bulletin

[Patent document 3] Japanese Patent Laid-Open No. 2000-022212 bulletin

[Patent document 4] Japanese Patent Laid-Open No. 2000-252217 bulletin

[Patent document 5] Japanese Patent Laid-Open No. 11-195814 bulletin

[Patent document 6] Japanese Patent Laid-Open No. 2000-049092 bulletin

[Patent document 7] Japanese Patent Laid-Open No. 2000-323753 bulletin

[Patent document 8] Japanese Patent Laid-Open No. 2000-323753 bulletin

[Patent document 9] Japanese Patent Laid-Open No. 2000-114178 bulletin

[Non-patent document 1] M. L. Gimpl, A. D. McMaster, and N. Fuschillo, "Journal of Applied Physics" (Journal of Applied Physics), 1964, Vol. 35, p. 3572

[Non-patent document 2] L. Bachmann, D. L. Sawner, and B. M. Siegel, "Journal of Applied Physics" (Journal of Applied Physics), 1965, Vol. 36, p. 304

SUMMARY OF THE INVENTION

Accordingly, an object of the invention is to provide a method for fabricating a III group nitride semiconductor substrate without the need of forming a low-temperature growth buffer layer and changing the temperature during the growth.

Further, another object of the invention is to provide a III group nitride semiconductor crystal grown by hetero epitaxial growth on a starting substrate, in which the strain with the starting substrate is more relaxed and the crystal dislocation is less than conventional methods.

Still further, still another object of the invention is to provide a III group nitride semiconductor substrate which allows the relaxation of the strain with the starting substrate during the hetero epitaxial growth of the III group nitride semiconductor crystal and allows the crystal growth of the thick film in which the self-standing substrate can be cut out.

In addition, a further object of the invention is to provide a III group nitride semiconductor substrate, a substrate for a III group nitride semiconductor device, and fabrication methods thereof, provided with a III group nitride semiconductor crystal with high quality in which a surface is a nonpolar surface.

As a result of serious researches in view of the above objects, the Inventors of the present invention found that strain with a starting substrate can be relaxed by forming a metal film or a metal nitride film with mesh structure in which innumerable micro voids are provided on a starting substrate and growing III group nitride semiconductor crystal via the metal film or metal nitride film, so that a III group nitride semiconductor crystal with less dislocation can be obtained, thereby inventing the present invention. In other words, the first method for fabricating a III group nitride semiconductor substrate according to the present invention comprises the steps of forming a metal film on a starting substrate, conducting a heat treatment for the starting substrate on which the metal film is formed to form innumerable micro voids which extend from a surface of the metal film to a surface of the starting substrate in the metal film, and growing a III group nitride semiconductor crystal via the metal film on the heat treated starting substrate.

The second method for fabricating a III group nitride semiconductor substrate according to the present invention comprises the steps of forming a metal film on a starting substrate, conducting a heat treatment for the starting substrate on which the metal film is formed in an atmosphere of gas containing a nitrogen element at a temperature of 800° C. or more to form a metal nitride film by nitriding the metal film and to form innumerable micro voids which extend from a surface of the metal film to a surface of the starting substrate in the metal nitride film, and growing a III group nitride semiconductor crystal via the metal nitride film on the heat treated starting substrate.

It is preferable that the starting substrate comprises a sapphire single crystal. As a preferred starting substrate, a (0001) face of a hexagonal system single crystal, in concrete, a single crystal substrate of sapphire ($Al_2O_3$), zinc oxide (ZnO), etc., or a (111) face of cubic system single crystal, in concrete, a single crystal substrate of silicon (Si), gallium arsenide (GaAs), etc are proposed. In addition, for obtaining the III group nitride semiconductor crystal in which a surface is a nonpolar surface, a surface of the starting substrate (a forming surface of a metal film or a metal nitride film) is used as a nonpolar forming surface. When the starting substrate is sapphire, a r-plane is the nonpolar forming surface. Herein, the nonpolar surface of the III group nitride semiconductor crystal is an a-plane or m-plane crystal plane.

The metal film to be formed on the starting substrate preferably comprises at least one element selected from a group composed of scandium (Sc), yttrium (Y), titanium (Ti), zirconium (Zr), hafnium (Hf), vanadium (V), niobium (Nb), tantalum (Ta), chromium (Cr), molybdenum (Mo), tungsten (W), rhenium (Re), iron (Fe), ruthenium (Ru), osmium (Os), cobalt (Co), rhodium (Rh), iridium (Ir), nickel (Ni), palladium (Pd), manganese (Mn), copper (Cu), platinum (Pt) and gold (Au). These metal films may be a multilayer film composed of a plurality of metals or an alloy film.

Heat treatment condition for forming the voids in the metal film to provide the mesh structure can be appropriately changed in accordance with the kind of the metal, since an optimum value for the heat treatment depends on the kind of the metal.

When the heat treatment is conducted simultaneously with the nitriding process, it is preferably conducted at a temperature of 800° C. or more. The gas containing the nitrogen elements to be used for the nitriding process of the metal film comprises preferably at least one element selected from a group composed of nitrogen, ammonia, hydrazine and dimethylhydrazine. These gases may further comprise hydrogen.

It is required that the metal film or the metal nitride film is thinner than 200 nm so as to provide voids that penetrate to the surface of the starting substrate. On the other hand, if the metal film or the metal nitride film is thinner than 2 nm, for example, a part of the metal film may be torn in the heat treatment or the like, so that it becomes difficult to homogeneously form the film with mesh structure on an entire surface of the substrate Therefore, the thickness of the metal film or the metal nitride film is preferably 2 to 200 nm, and more preferably 10 to 100 nm.

It is preferable that the process for growing a III group nitride semiconductor crystal is conducted at a temperature of 900° C. or more, and more preferably at a temperature of 950° C. or more so as to keep the quality of the III group nitride semiconductor crystal high. When the crystal growth temperature is lower than 900° C., the dislocation in the crystal increases, so that it becomes difficult to keep the high quality. While the high quality crystal is colorless and transparent, when the dislocation in the crystal increases, a phenomenon that the crystal is colored by yellow to brown is observed. As for an upper limit of the crystal growth temperature, 1180° C. is preferable to avoid the heat decomposition of the crystal.

An area of each opening of the voids provided in the metal film or the metal nitride film is preferably $1 \times 10^{-9}$ $m^2$, and more preferably $1 \times 10^{-15}$ to $1 \times 10^{-12}$ $m^2$. This void plays a role to provide a nuclei generating site at an initial growth stage in the crystal growth of the III group nitride semiconductor, so that it is preferable to generate a crystal nuclei from one void as few as possible, and it is more preferable to generate a single crystal nuclei from a single void. When the area of each opening is greater than $1\times10^{-9}$ m$^2$, numerous crystal nucleuses are generated from the void, so that the strain relaxation effect by virtue of a porous film is decreased, as a result, it is often that a crack may occur in the crystal during the crystal growth or that the grown crystal becomes polycrystal. On the other hand, if the area of each opening is smaller than $1\times10^{-16}$ m$^2$, it does not function as the nuclei generating site, so that the strain relaxation effect cannot be obtained. It is preferable that the voids are substantially homogeneously distributed in the metal film or the metal nitride film. According to this, the III group nitride semiconductor crystal can be homogeneously grown on the starting substrate. When the distribution of the voids is heterogeneous, a thickness distribution of the III group nitride semiconductor crystal or a dislocation distribution of the crystal becomes heterogeneous at the surface of the substrate, so that the crack may occur in the crystal during the growth, and it may cause that the grown crystal becomes a polycrystal.

A total area of the opening of the void provided in the metal film or the metal nitride film is preferably 10 to 90 area %, and more preferably 30 to 70 area % for a surface area of the starting substrate. When the total area of the opening is smaller than 10 area % for the surface area of the starting substrate, even if the III group nitride semiconductor crystal is grown, the crystal surface may not be flattened, or the nuclei may be generated from a region other than the inside of the void, so that the crystal surface may be roughened or the grown crystal may become polycrystal. On the other hand, the area of the opening of the void is greater than 90 area %, it becomes difficult to maintain the configuration of the porous film, thereby producing a factor obstructing the single crystal growth of the III group nitride semiconductor.

A film thickness of the III group nitride semiconductor crystal is preferably 500 nm or more, and it is desirable that the surface thereof is substantially flattened. By providing the film thickness of 500 nm or more, adjacent ones of the initial growth nucleuses in the III group nitride semiconductor crystal, that are generated from the voids provided in the metal film or the metal nitride film, are bound to each other, so that the entire surface can be flattened. An upper limit of the film thickness of the III group nitride semiconductor crystal is not limited in particular. When the III group nitride semiconductor crystal is thinner than 500 nm, a lot of pits or steps appear on the crystal surface, and it may become a great obstacle for fabricating a device by using the obtained crystal.

Additionally, in case where the surface of the III group nitride semiconductor crystal is the nonpolar surface, it is also a preferred embodiment that such III group nitride semiconductor crystal constitutes a device structure comprising a plurality of III group nitride semiconductor epitaxial layers, and in that case, the III group nitride semiconductor crystal has a thickness of an ordinary epitaxial layer for the device.

The crystal growth of the III group nitride semiconductor is preferably conducted by using any one of MOVPE (Metal Organic Vapor Phase Epitaxy) method and HVFE (Hydride Vapor Phase Epitaxy) method, or the combination thereof. Particularly in the initial stage of the crystal growth, it is preferable to use the MOVPE method in which the crystal growth speed is relatively slow and that the generation of the initial growth nuclei can be obtained enough, and when the crystal growth is once begun, it is preferable to use the HVPE method in which high crystal growth speed can be obtained. In addition, it is also preferable to use MOHVPE method in which the advantages of both methods are combined.

It is preferable to selectively generate the nuclei from the inside of the voids formed in the metal film or the metal nitride film at the initial growth stage in the process for growing the III group nitride semiconductor crystal. When the micro voids provided in the metal film or the metal nitride film play a role to provide the nuclei generating site at the initial growth stage when conducting the crystal growth of the III group nitride semiconductor. Namely, since there is a surface energy difference between the metal film or the metal nitride film and the starting substrate, materials that extend to a surface of the metal film or the metal nitride in the crystal growth of the III group nitride semiconductor move on the starting substrate within the void because of the surface migration, so that crystal growth nuclei is selectively formed there. By conducting the crystal growth of the III group nitride semiconductor via the metal film or the metal nitride film provided with the micro voids, it is possible to control the density of the initial nuclei generation of the III group nitride semiconductor crystal without depending on the lattice constant of the starting substrate, so that it is possible to conduct the crystal growth in which the occurrence of dislocation can be significantly suppressed compared with the case where the metal film or metal nitride film is not provided. In addition, the metal film or the metal nitride film having the micro voids has an effect of relaxing the strain due to the lattice mismatch between the starting substrate and the III group nitride semiconductor crystal and due to a difference in linear expansion coefficients therebetween, as a result, it is possible to provide the III group nitride semiconductor crystal substrate in which the occurrence of the crystal dislocation is low and warping is small. In addition, even if a thick film crystal of 1 mm or more is grown, the crack will not occur in the crystal. Accordingly, it is possible to fabricate a III group nitride semiconductor self-standing substrate by growing a large-sized crystal of 1 mm or more and cutting out a part of the III group nitride semiconductor crystal which is grown.

According to material of the starting substrate or material of the metal, it is expected that the initial growth nuclei of the III group nitride semiconductor crystal may be selectively generated on the metal film or metal nitride film. For this case, the generation of the nuclei will not occur from the inside of the voids contrary to the aforementioned case, and the crystal nuclei is generated from a limited region on the metal film or the metal nitride film, and the crystal growth advances in the manner that the III group nitride semiconductor crystal is over-grown on the micro voids of the metal film or the metal nitride film, as result, a high quality crystal can be grown without using the low-temperature buffer layer similarly to the case where the nuclei is selectively generated within the void. For this case, the voids provided in the metal film or the metal nitride film functions to relax the strain due to the lattice mismatch between the starting substrate and the III group nitride semiconductor crystal and due to the difference in the linear expansion coefficients therebetween.

The III group nitride semiconductor substrate according to the present invention can be fabricated by the aforementioned fabrication method. In other words, the first III group nitride semiconductor substrate according to the present invention is characterized by that a III group nitride semiconductor crystal is formed via a metal film with mesh structure in which micro voids are provided. In addition, the second III group nitride semiconductor substrate according to the present invention is characterized by that a III group nitride semiconductor crystal is formed via a metal nitride film with mesh structure in which micro voids are provided.

As described above, the patent documents 5 to 8 disclose methods for growing a III group nitride semiconductor crystal via a titanium nitride or the like. However, this titanium nitride is used for the purpose of reducing the lattice mismatch between the intervening layer and the III group nitride semiconductor crystal. On the other hand, the fabrication method according to the present invention is characterized by that the micro voids are provided in the metal film or the metal nitride film and the voids are provided with the nuclei generating site for the III group nitride semiconductor crystal.

In other words, the metal film or the metal nitride film and the III group nitride semiconductor crystal are not continuously lattice matched at the interface therebetween. Therefore, the fabrication method according to the present invention does not depend upon the lattice matching between the metal film or the metal nitride film and the III group nitride semiconductor crystal, that is not likely to the methods described in the aforementioned patent documents, and the function and effect of the metal film or the metal nitride film are also different therefrom.

Further, as for a mask disclosed in the patent document 9, an effect of providing the nuclei generating site to a limited extent like the fabrication method according to the present invention cannot be expected. In the fabrication method according to the present invention, the metal film or the metal nitride film having the micro voids can be self-assembled by a heat treatment of the metal film, which is a simple and easy method without the need for the photolithography process, so that insertion of the low-temperature buffer layer is not necessary, and the nuclei generating site for the III group nitride semiconductor crystal can be provided to a limited extent.

According to the present invention, the metal film or the metal nitride film in which the micro voids are formed is formed on the starting substrate, so that the crystal growth of the III group nitride semiconductor is started from the voids. The micro voids formed in the metal film or the metal nitride film function as the nuclei generating site at the initial growth of the III group nitride semiconductor crystal, and relax the strain due to the lattice mismatch between the starting substrate and the III group nitride semiconductor crystal and due to the difference in the linear expansion coefficients therebetween. Therefore, the III group nitride semiconductor substrate with low dislocation density and less warping can be obtained without using the low-temperature growth buffer layer.

The III group nitride semiconductor substrate according to the present invention can be broadly used as a substrate for a GaN-based device. Particularly, when used as the substrate for a laser diode or a high power light emitting diode device, a high quality GaN-based crystal with low dislocation density can be provided, so that it is possible to fabricate a device with high reliability and high performance.

In addition, according to the present invention, by providing a surface of the starting substrate (a forming surface of the metal film or the metal nitride film) as a nonpolar forming surface, it is possible to provide a III group nitride semiconductor substrate, a substrate for a III group nitride semiconductor device and fabrication methods thereof, each of which is provided with a high quality III group nitride semiconductor crystal having a nonpolar surface at its surface.

BRIEF DESCRIPTION OF THE DRAWINGS

FIG. 7 is a schematic cross-sectional view showing a substrate for LED which is an example of a substrate for a III group nitride semiconductor device according to the present invention; and FIG. 8 is a schematic cross-sectional view showing a LD device fabricated by using a substrate for a LD which is an example of the substrate for a III group nitride semiconductor device according to the present invention.

DETAILED DESCRIPTION OF THE PREFERRED EMBODIMENTS

Figure 1:
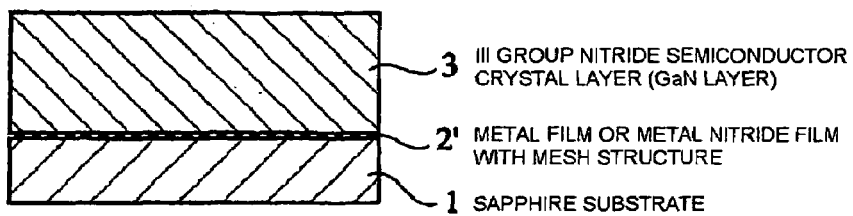
FIG. 1 is a schematic cross-sectional view showing an example of III group nitride semiconductor substrate according to the present invention.

FIG. 1 shows an example of III group nitride semiconductor substrate of the present invention. A metal film or a metal nitride film 2' with mesh structure in which micro voids are provided is formed on a sapphire substrate 1, and a III group nitride semiconductor crystal layer 3 is formed via the metal film or the metal nitride film 2'. The method of fabricating a III group nitride semiconductor substrate according to the present invention may adopt various arrangements for respective processes or materials to be used for the III group nitride semiconductor substrate. It is preferable that the metal film or the metal nitride film 2' is formed on an entire surface of a starting substrate (sapphire substrate 1). According to this structure, the micro voids can be formed over the entire surface of the substrate, thereby growing the III group nitride semiconductor crystal layer 3 homogeneously as well as relaxing the strain more effectively.

It is preferable that the metal film or the metal nitride film satisfies the following conditions.

(i) A melting point or a decomposition starting temperature of the metal film or the metal nitride film is higher than a growth temperature of the III group nitride semiconductor formed thereon, and a form of the film can be kept at the growth temperature.

(ii) A vapor pressure at the growth temperature for the III group nitride semiconductor layer is low enough, and sublimation does not occur in the growth temperature.

(iii) In the growth temperature for the III group nitride semiconductor layer, the metal film or the metal nitride film does not react with a nitride semiconductor and source gas thereof, or the gas (ammonia gas or hydrogen gas) in a growth atmosphere, so that the crystal orientation is not perturbed.

(iv) The metal film or the metal nitride film can transmit the orientation of the starting substrate, and can be oriented in the [0001] axis direction if it is a hexagonal system on the starting substrate and can be oriented in the [111] axis direction if it is a cubic system.

The III group nitride semiconductor substrate having an excellent crystal quality can be obtained by forming the metal film or the metal nitride film satisfying the above conditions.

The metal film or the metal nitride film may be a single film or a composite film in which more than two kinds of layers are laminated. For the metal nitride film, a metal film comprising metallic element which is easy to be nitrided is used, and the nitriding treatment and the heat treatment can conducted simultaneously by exposing it to the growth gas atmosphere for the III group nitride semiconductor layer. For the metallic element composing the metal film, titanium, tantalum, tungsten or the like are preferable. For this case, it is not absolutely necessary to provide a process for nitriding, and a process for controlling a degree of the nitriding may be provided independently. For the method for forming the metal film, vacuum deposition, sputtering method, various chemical vapor depositions or the like can be used.

When titanium is selected as the material of the metal film, the heat treatment is preferably conducted at 700 to 1400 t to nitride the metal film and form substantially homogeneous voids, and more preferably at 800 to 1200 t. If it is lower than 700° C., the nitriding reaction will not progress enough and the substantially homogeneous voids cannot be formed. In addition, if the temperature exceeds 1400° C., the metal nitride film will not be flat. It is preferable to conduct the heat treatment at 700 to 1200° C., when a nitride semiconductor substrate or a nitride semiconductor epitaxial wafer is used as the starting substrate. If the temperature exceeds 1200° C., the heat decomposition of the single crystal gallium nitride layer progresses in excess, and there is a risk that metal nitride film may be exfoliated.

For the method for growing the III group nitride semiconductor layer, various kinds of methods including MOCVD method (Metalorganic chemical vapor deposition method), MBE method (molecular beam epitaxy method), HVPE method (Hydride vapor phase epitaxy method) or the like may be used. It is preferable to use the HVPE method for growing a thick film of the III group nitride semiconductor so as to obtain an ingot of the III group nitride semiconductor. It is because that the crystal growth speed is high and the thick film can be easily obtained. However, the present invention is not limited to the HVPE method, and other methods including the MOCVD methods or the like may be used, further, the combination of a plurality of growth methods may be used (the III group nitride semiconductor may be grown by using the MOCVD method halfway, and the III group nitride semiconductor may be grown to be thick by using the HVPE method thereafter).

For the growth of the III group nitride semiconductor layer, inert gas or mixed gas of the inert gas and hydrogen or the like may be used as a carrier gas. For the inert gas, at least one kind of gas selected from a group composed of $N_2$, He, Ne, Ar, Kr and Xe may be used. In the case of forming the III group nitride layer, the inert gas of nitrogen or the like may be used as the carrier gas at the initial growth, and the carrier gas may be changed to the hydrogen thereafter to grow a layer with excellent crystallinity.

For the starting substrate, a substrate comprising various kinds of materials may be used. As a preferred substrate, a different material substrate such as sapphire, silicon, SiC, Langasite, Al, GaAs, γ-LiAlO$_2$ or the like, and a substrate comprising a III group nitride semiconductor such as GaN, AlN, AlGaN or the like may be proposed. When the sapphire is used as the substrate material, C-plane, A-plane, R-plane or the like may be used. It does not matter if the starting substrate has the off-angle, however, it is preferable that the off-angle is within 1°. By keeping the off-angle within 1°, the orientation of the metal film or the metal nitride film can be kept well and the III group nitride semiconductor layer can be grown well.

In addition, by providing the surface of the starting substrate (the forming surface of the metal film or the metal nitriding film) as the nonpolar forming surface, a high quality III group nitride semiconductor crystal having the nonpolar surface at its surface can be obtained. A crystal plane to be used for the nonpolar forming surface may be changed in accordance with the substrate material for the starting substrate. For example, when the starting substrate is sapphire, the nonpolar forming surface will be the r-plane, when the starting substrate is γ-LiAlO$_2$, the (100) plane will serve as the nonpolar forming surface, when the starting substrate is SiC, the a-plane or the m-plane will serve as the nonpolar forming surface, and when the starting substrate is a III group nitride semiconductor, the nonpolar surface (i.e. the a-plane or the m-plane) will serve as the nonpolar forming surface.

The III group nitride semiconductor layer may comprise various kinds of semiconductor layers. For example, a semiconductor layer such as GaN, AlGaN, InGaN, InAlGaN or the like may be used. In addition, the self-standing substrate of the III group nitride semiconductor can be obtained by exfoliating and removing the starting substrate after forming the III group nitride semiconductor layer. In the present specification, the word "self-standing substrate" means a substrate having the strength enough to hold its proper configuration as well as the strength in which any inconvenience does not occur for handling. For a method for removing the starting substrate, a method of mechanically exfoliating the starting substrate by applying a stress to a portion having a gap in a wafer after growth, a method of exfoliating the starting substrate by removing a metallic element-containing film or a region provided with a gap in the III group nitride semiconductor layer by etching, or the like may be used.

The method for fabricating a III group nitride semiconductor substrate according to the present invention may be modified to provide any variations other than the aforementioned configurations, within a range which does not go beyond the object of the present invention. For example, it may be applied to the fabrication of a single crystal self-standing substrate of a ternary mixed crystal such as AlGaN, InGaN, or the like, and the fabrication of a p-type GaN substrate doped with Mg or the like. In the III group nitride semiconductor substrate according to the present invention, the micro voids provided in the metal film or the metal nitride film may be formed by the photolithography or electron beam lithography after the film formation as well as the aforementioned self-assembling technique which is simple and easy.

EXAMPLES

The present invention will be explained in more detail in the following examples, but the present invention is not limited thereto.

Example 1

Figure 2:
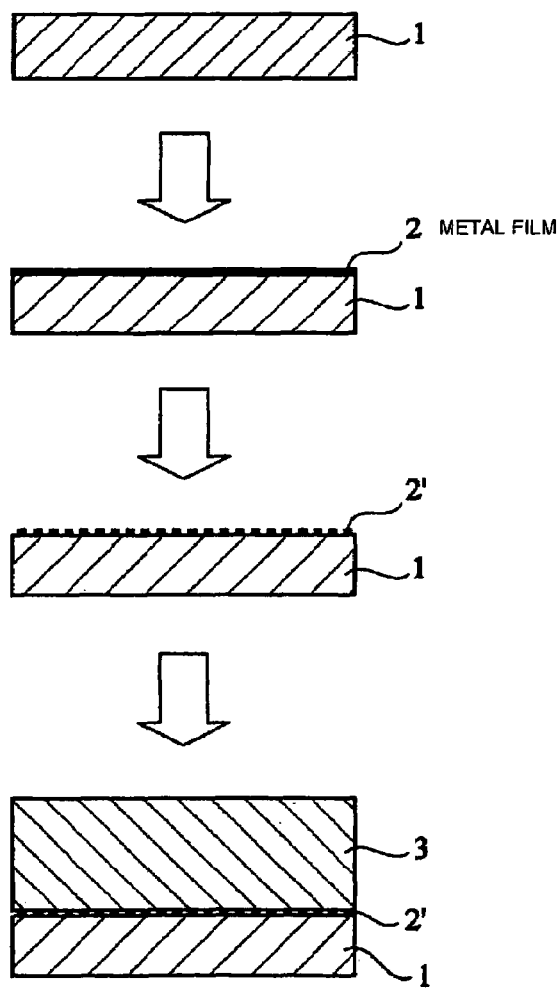
FIG. 2 is a process cross-sectional view showing an example of a method for fabricating the III group nitride semiconductor substrate according to the present invention.
Figure 4:
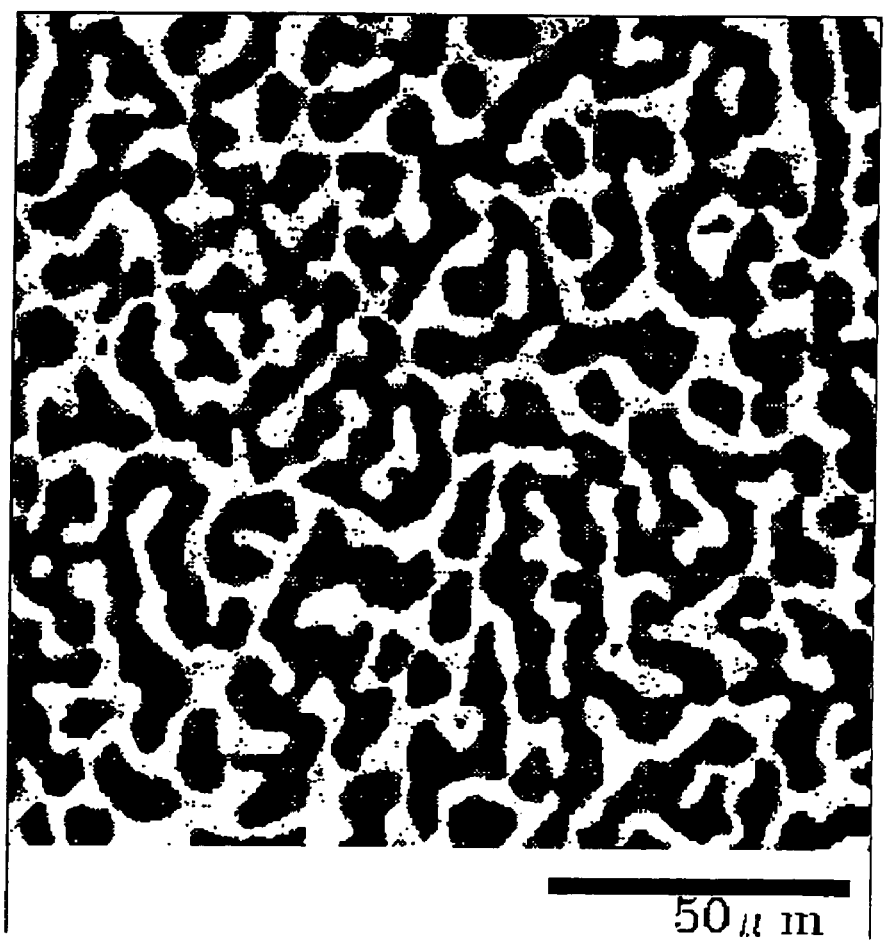
FIG. 4 is a scanning electron microscope (SEM) photograph showing a surface of a Pt film with mesh structure in the EXAMPLE 1.

In accordance with fabrication process shown in FIG. 2, a III group nitride semiconductor substrate as below was fabricated. At first, a metal (Pt) film 2 having a thickness of 30 nm was vacuum-evaporated directly on a C-plane of a single crystal sapphire substrate 1 having a diameter of 2 inches as a starting substrate. This substrate was placed in an electric furnace, and the heat treatment was conducted at 1150° C. for 30 minutes in a flow of N$_2$ gas, as a result, the evaporated film of Pt was self-assembled by agglomeration mechanism to provide a metal (Pt) film 2' with mesh structure comprising numerous micro voids. A surface of the metal (Pt) film 2' with mesh structure was observed by the electron microscope, and as shown in FIG. 4, and it was confirmed that the mesh structure in which elongated voids each having a width of 3 to 5 μm and branching locally (an area of each opening is $1 \times 10^{-9}$ m$^2$ or less) are substantially homogenously distributed over the entire surface of the substrate. A total area of the openings of the voids obtained by observing the surface by the electron microscope was 60 to 70 area %, where the surface area of the starting substrate is defined as 100 area %.

The substrate on which the metal (Pt) film 2' with mesh structure was formed was placed in a HVPE furnace, and the substrate temperature was increased up to 1050° C., then a GaN layer 3 was grown directly on the substrate by using GaCl and $NH_3$ as source and $SiH_2Cl_2$ as dopant to have a thickness of 500 μm. The growth was conducted at a normal pressure and a mixed gas of 10 volume % of $H_2$ and 90 volume % of $N_2$ was used as the carrier gas. In addition, a GaCl partial pressure and a NH3 partial pressure in a feed gas were $8\times10^{-3}$ atm and $8\times10^{-2}$ atm, respectively. A GaN epitaxial growth substrate with a configuration shown in FIG. 1 was obtained by the aforementioned process.

The X-ray diffraction analysis of the GaN epitaxial growth substrate thus obtained was conducted, and it was confirmed that the grown GaN layer 3 was a single crystal having a (0001) plane at its surface. In addition, half bandwidths of rocking curves having peaks at (0002) and (10-10) were measured, and good values of 220 seconds and 450 seconds respectively were shown.

Example 2

Figure 5:
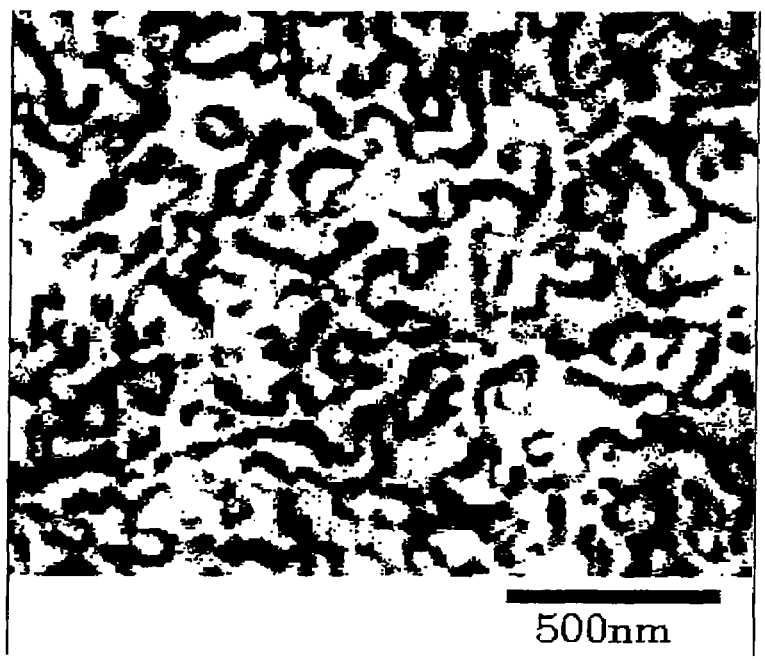
FIG. 5 is a scanning electron microscope (SEM) photograph showing a surface of a TiN film with mesh structure in the EXAMPLE 2.

In accordance with a fabrication process shown in FIG. 2, a III group nitride semiconductor substrate as below was fabricated. At first, a metal (Ti) film 2 having a thickness of 20 nm was vacuum-evaporated by using an EB evaporator directly on a C-plane of a single crystal sapphire substrate 1 having a diameter of 2 inches as a starting substrate. This substrate was placed in an electric furnace, and the heat treatment was conducted at 1050° C. for 30 minutes in a flow of a mixed gas of $H_2$ gas and $NH_3$ gas, as a result, the evaporated film of Ti was self-assembled by agglomeration mechanism into mesh structure comprising numerous micro voids and nitrided by $NH_3$ into TiN, to provide a metal nitride (TiN) film 2' with mesh structure, A surface of the metal nitride (TiN) film 2' with mesh structure was observed by the electron microscope, and as shown in FIG. 5, and it was confirmed that the mesh structure in which elongated voids each having a width of 30 to 50 nm and branching locally (an area of each opening is $1\times10^{-9}$ $m^2$ or less) were substantially homogenously distributed over the entire surface of the substrate. In addition, particular changes were not admitted in the starting sapphire substrate. A total area of the openings of the voids obtained by observing the surface by the electron microscope was 45 to 55 area %, where the surface area of the starting substrate is determined as 100 area %. The X-ray diffraction analysis of this substrate was conducted, a diffraction peak of TiN was observed, and it was confirmed that the metal nitride (TiN) film 2' with mesh structure was a film oriented in a [111] direction.

The substrate on which the metal nitride (TiN) film 2' with mesh structure was formed was placed in a MOVPE furnace, and the substrate temperature was elevated up to 1050° C., then an undoped GaN layer 3 was grown on the substrate by using trimethylgallium (TMG) and $NH_3$ as source to have a thickness of 2 μm.

A GaN epitaxial growth substrate with a configuration shown in FIG. 1 was obtained by the aforementioned process. The surface of the GaN epitaxial growth substrate thus obtained has a mirror surface at its surface, and it was confirmed by microscope observation that the substrate was a substantially flat film with good quality except that some terrace-shaped morphology was observed.

The X-ray diffraction analysis of the GaN epitaxial growth substrate thus obtained was conducted, and it was confirmed that the grown GaN layer 3 was a single crystal having a (0001) plane at its surface. In addition, half bandwidths of rocking curves having peaks at (0002) and (10-10) were measured, and they were 280 seconds and 450 seconds respectively, which are the values equal to or more than the values of the GaN film obtained by using the conventional low-temperature growth buffer layer. In particular, it was observed that in the half bandwidth of the rocking curve having a peak at (10-10) was smaller than that of the crystal grown by the conventional method. This is an advantage of the GaN which was grown via the film with mesh structure comprising micro voids.

A surface of the GaN epitaxial substrate thus obtained was dipped into a heated mixed liquid of phosphoric acid and sulfuric acid (250° C.) and the dislocation density at an etch pit was observed, as a result, it was confirmed that the substrate has high crystallinity in which the dislocation density was $8\times10^7$ $pcs/cm^2$ which is low.

Example 3

Figure 6:
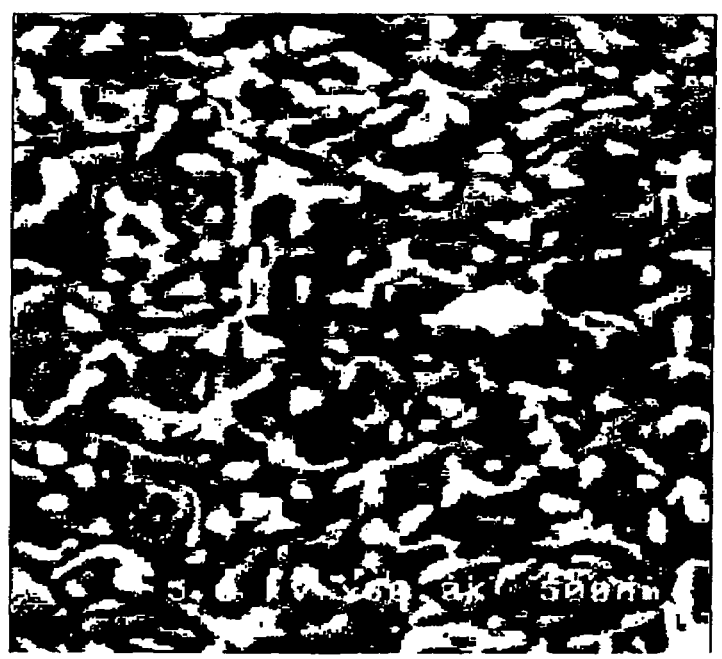
FIG. 6 is a scanning electron microscope (SEM) photograph showing a surface of a TiN film with mesh structure in the EXAMPLE 3.

For the purpose of observing a state of the initial crystal growth when conducting the crystal growth of GaN in the MOVPE furnace, the substrate on which the metal nitride (TiN) film 2' with mesh structure was formed in the process same as the EXAMPLE 2 was fabricated, then the growth in the MOVPE furnace was conducted for about 5 minutes then stopped and quenched, and the state of the surface of a sample taken out therefrom was observed by the electron microscope. As shown in FIG. 6, the GaN has started to be selectively grown from the mesh of TiN, and it was not observed that the state where the crystal nuclei of the GaN was generated on the TiN.

Example 4

Figure 3:
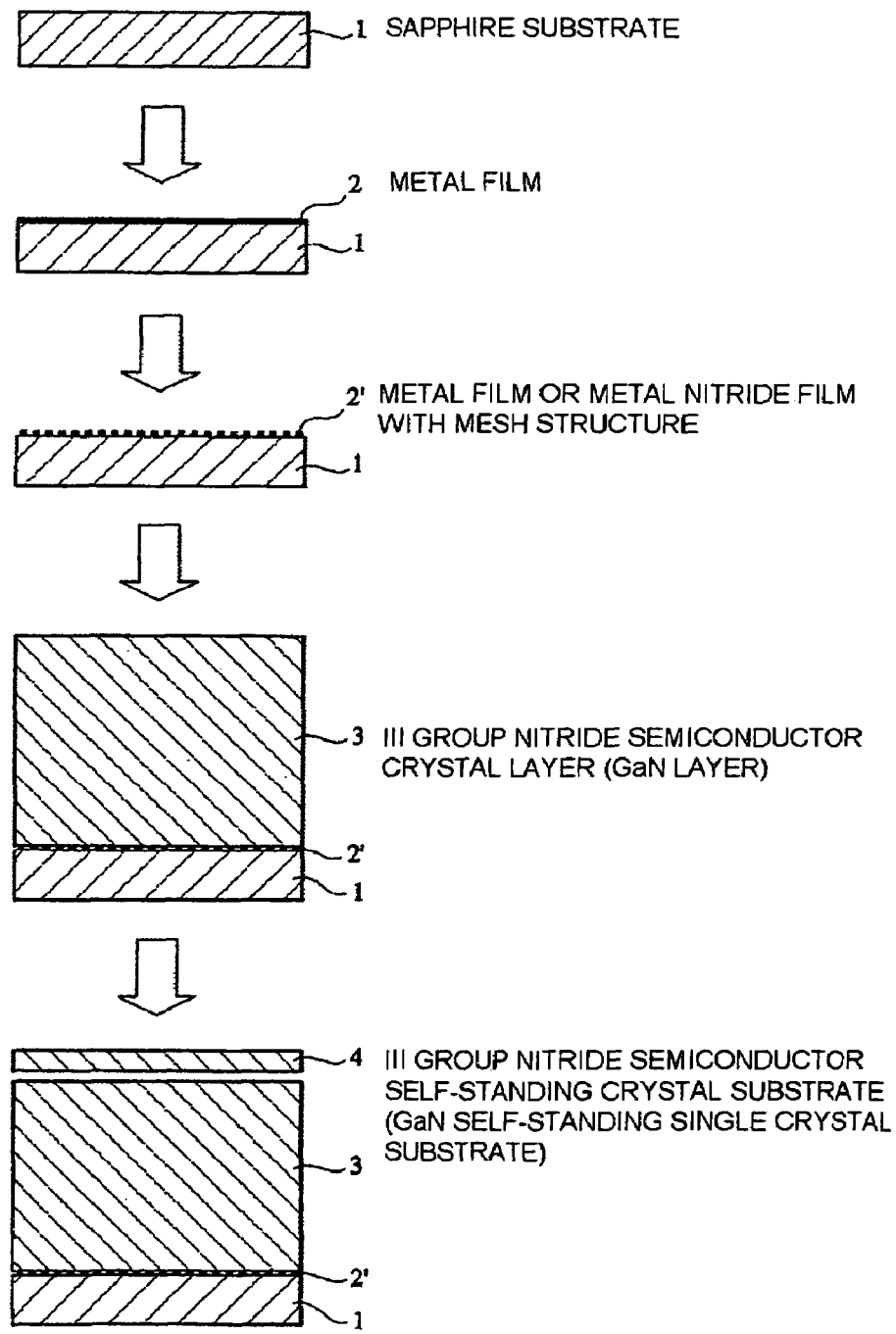
FIG. 3 is a process cross-sectional view showing another example of the method for fabricating the III group nitride semiconductor substrate according to the present invention.

In accordance with a fabrication process shown in FIG. 3, a III group nitride semiconductor substrate as below was fabricated. At first, a metal (Ti) film 2 having a thickness of 20 nm was vacuum-evaporated by using the EB evaporator directly on a C-plane of a single crystal sapphire substrate 1 having a diameter of 2 inches as a starting substrate. This substrate was placed in an electric furnace, and the heat treatment was conducted at 1050° C. for 30 minutes in a flow of mixed gas of $H_2$ gas and $NH_3$ gas, as a result, the evaporated film of Ti was self-assembled by agglomeration mechanism into mesh structure comprising micro voids and nitrided by $NH_3$ into TiN, to provide a metal nitride (TiN) film 2' with mesh structure.

The substrate on which the metal nitride (TiN) film 2' with mesh structure was formed was placed in a HVPE furnace, and the substrate temperature was elevated up to 1040 t in an atmosphere of $N_2$, then a GaN layer 3 was grown to have a thickness of about 3 mm to form a III group nitride semiconductor crystal layer (HVPE-GaN layer) 3. $NH_3$ and GaCl were used as the growth source. A GaCl partial pressure and a $NH_3$ partial pressure in the feed gas were $8\times10^{-3}$ atm and $5.6\times10^{-2}$ m, respectively, and a V/III ratio was 7. The growth was conducted at the normal pressure, and $N_2$ gas mixed with 10 vol % of $H_2$ was used as a carrier gas. The GaN was grown for about 20 μm under this condition, then the carrier gas was changed to $H_2$, and the GaN was sequentially grown and a thick film of the GaN layer 3 was obtained.

The thick film epitaxial wafer of GaN thus obtained was once stuck by wax on a ceramic piece which is a base, and sliced in parallel with a surface of GaN by a wire saw, so that a GaN self-standing single crystal substrate 4 was cut out. Since the surface of GaN thus obtained was in the condition where hillocks or the like which are the morphology of the as-grown are left or in the irregular condition where saw marks are left, the surface was finished flatly by using diamond abrasive grains. As a result, the GaN self-standing single crystal substrate 4 having the mirror surface at its surface was obtained.

A surface of the GaN self-standing single crystal substrate 4 thus obtained was dipped into a heated mixed liquid of phosphoric acid and sulfuric acid (250° C.) and the dislocation density at an etch pit was observed, as a result, it was confirmed that the substrate has a high crystallinity in which the dislocation density was $1 \times 10^7$ pcs/cm$^2$, which is very low.

Example 5

The GaN epitaxial substrate obtained in the EXAMPLE 2 was placed in a HVPE furnace, and the substrate temperature was elevated up to 1040° C. in an atmosphere of $N_2$, then a GaN layer 3 was grown to have a thickness of about 15 mm to form a III group nitride semiconductor crystal layer (HVPE-GaN layer) 3. $NH_3$ and GaCl were used as the growth source. A GaCl partial pressure and a $NH_3$ partial pressure in the feed gas were $8 \times 10^3$ atm and $5.6 \times 10^{-2}$ atm, respectively, and a V/III ratio was 7. The growth was conducted at the normal pressure, and a $N_2$ gas mixed with 10 vol % of $H_2$ was used as a carrier gas.

The thick film epitaxial wafer of GaN thus obtained was once stuck by wax on a ceramic piece which is abase, and sliced in parallel with a surface of GaN by a wire saw, and a GaN self-standing single crystal substrate was cut out. Since front and back surfaces of GaN thus obtained are in the condition where hillocks or the like which are the morphology of the as-grown are left or in the irregular condition where saw marks are left, the surface was finished flatly by using diamond abrasive grains. As a result, the GaN self-standing single crystal substrate 4 having the mirror surface at is surface was obtained. The GaN self-standing substrate thus obtained was colorless and transparent.

Example 6

A III group nitride semiconductor substrate was fabricated similarly to the EXAMPLE 1, except that a sapphire substrate in which an A-plane is the growth surface was used as a starting-substrate instead of the sapphire substrate in which a C-plane is the growth surface. In comparison with the EXAMPLE 1 in which the C-plane sapphire was used, the III group nitride semiconductor substrate having a larger diameter could be easily obtained.

Example 7

A III group nitride semiconductor substrate was fabricated similarly to the EXAMPLE 1, except that aluminum gallium nitride (AlGaN) was grown instead of growing GaN. Growth conditions of the AlGaN are as follows. A substrate temperature was 1060° C., TMG, trimethylaluminum (TMA) and $NH_3$ were used as growth source, a mixed gas of 40 vol % of $H_2$ and 60 vol % of $N_2$ was used as a carrier gas, and TMG partial pressure, TMA partial pressure and $NH_3$ partial pressure were $6.5 \times 10^{-7}$ atm, $1.0 \times 10^{-7}$ atm and 0.1 atm, respectively. It was confirmed by the X-ray diffraction analysis that the substrate thus obtained was a single crystal substrate similarly to the substrate in the EXAMPLE 1.

Example 8

A III group nitride semiconductor substrate was fabricated similarly to the EXAMPLE 1, except that indium gallium nitride (InGaN) was grown instead of growing GaN. Growth conditions of the InGaN are as follows. A substrate temperature was 750° C., TMG, trimethylindium (TMI) and $NH_3$ were used as growth source, a mixed gas of 2 vol % of $H_2$ and 98 vol % of $N_2$ was used as carrier gas, and TMG partial pressure, TMA partial pressure and $NH_3$ partial pressure were $6.5 \times 10^{-7}$ atm, $5 \times 10^{-8}$ atm and 0.1 atm, respectively. It was confirmed by the X-ray diffraction analysis that the substrate thus obtained was a single crystal substrate similarly to the substrate in the EXAMPLE 1.

Example 9

A III group nitride semiconductor substrate was fabricated similarly to the EXAMPLE 1, except that a nickel film, a tungsten film and a molybdenum film were respectively formed as metal films instead of the Pt film. The nickel film, tungsten film and molybdenum film after the heat treatment were observed by the electron microscope, and the mesh structure same as that in the Pt film in the EXAMPLE 1 was admitted. The X-ray diffraction analysis was conducted for the substrate in which the GaN layer was grown on the substrate where the metal film 2' with mesh structure was formed, and it was confirmed that the GaN layer was a single crystal in case where any metal film was used.

Example 10

A III group nitride semiconductor substrate was fabricated similarly to the EXAMPLE 2, except that the porous metal nitride (TiN) film was formed by providing a TiN film by sputtering method and forming micro voids on an entire surface of the TiN film by photolithography. The substrate thus obtained was a single crystal substrate having a high crystallinity same as the substrate in the EXAMPLE 2.

Example 11

A III group nitride semiconductor substrate was fabricated similarly to the EXAMPLE 1, except that a r-plane of a sapphire substrate was used as a starting-substrate instead of a C-plane of the sapphire substrate.

The X-ray diffraction analysis of the GaN epitaxial growth substrate thus obtained was conducted and it was confirmed that the grown GaN layer 3 was the single crystal having a-plane ((11-20) plane) which was a nonpolar surface at its surface. In addition, half bandwidth of a rocking curve measured by the X-ray diffraction was 350 seconds, which was a good value.

In addition, III group nitride semiconductor substrates were made similarly by using (100) plane of γ-LiAlO$_2$ substrate, a-plane of a SiC substrate, a-plane of a CaN substrate respectively instead of using the sapphire substrate as the starting substrate, and it was confirmed that they have nonpolar surfaces at their surfaces similarly.

Example 12

A III group nitride semiconductor substrate was fabricated similarly to the EXAMPLE 2, except that a r-plane of the sapphire substrate was used as a starting-substrate instead of a C-plane of the sapphire substrate.

The X-ray diffraction analysis of the GaN epitaxial growth substrate thus obtained was conducted and it was confirmed that the grown GaN layer 3 was the single crystal having a-plane ((11-20) plane) which was a nonpolar surface at its surface. In addition, half bandwidth of a rocking curve measured by the X-ray diffraction was 380 seconds, which was a good value. In addition, III group nitride semiconductor substrates were made similarly by using (100) plane of γ-LiAlO$_2$ substrate, a-plane of a SiC substrate, a-plane of a GaN substrate respectively instead of using the sapphire substrate as the starting substrate, and it was confirmed that they have nonpolar surfaces at their surfaces similarly.

Example 13

FIG. 7 shows a substrate for a LED in one embodiment of the substrate for a III group nitride semiconductor device according to the present invention. A substrate 18 for a LED comprises a substrate 13 for epitaxial growth in which a metal (Pt) film 12 with mesh structure is formed on a sapphire substrate 11. This substrate 13 for epitaxial growth was fabricated similarly to the EXAMPLE 1, except that a r-plane of a sapphire substrate was used as the starting substrate instead of using a C-plane of the sapphire substrate.

On this substrate 13 for epitaxial growth, a n-type GaN layer 14 having a thickness of 4 μm, an In$_{0.2}$Ga$_{0.8}$N/GaN-3-MQW active layer (a well layer of 3 nm, a barrier layer of 10 nm) 15, a p-type Al$_{0.1}$Ga$_{0.9}$N layer 16 having a thickness of 40 nm, and a p-type GaN layer 17 having a thickness of 500 nm are sequentially laminated by using the MOVPE method to provide a plurality of III group nitride semiconductor epitaxial layers having a LED structure.

The X-ray diffraction analysis was conducted for a surface of the p-type GaN layer 17, and it was confirmed that it has a-plane ((11-20) face) which was a nonpolar surface at its surface.

Crystallinity of the epitaxial layer was good, and an emission power of the LED was also good.

According to this substrate 18 for a LED, a nanomask structure of the metal (Pt) film 12 which is an interface between the n-type GaN layer 14 and the sapphire substrate 11 shows an effect like a photonic crystal, and light generated at the active layer 15 passes through without reflecting at the interface. Accordingly, much light enters into the sapphire substrate 11 in which a difference in refractive indices with the air is small, and there is an advantage in that efficiency for taking out the light is improved.

Example 14

In the substrate 18 for a LED shown in FIG. 7 explained in the EXAMPLE 13, a metal nitride (TiN) film 12 with mesh structure was formed instead of the metal (Pt) film 12 with mesh structure to fabricate the substrate 18 for a LED.

The substrate 13 for epitaxial growth in which the (TiN) film 12 with mesh structure was formed on the sapphire substrate 11 was fabricated by the same process as that in the EXAMPLE 2, except that the r-plane of the sapphire substrate was used as the starting substrate instead of the C-plane of the sapphire substrate. The formation of the epitaxial layer for a LED on the substrate 13 for epitaxial growth was conducted similarly to the EXAMPLE 13.

In this substrate 18 for a LED, it was also found that there are characteristics and effects similar to those in the EXAMPLE 13.

Example 15

FIG. 8 shows a LD device fabricated by using a substrate for a LD in one embodiment of the substrate for a III group nitride semiconductor device according to the present invention.

A LD device 32 comprises a substrate 23 for epitaxial growth in which a metal (Pt) film 22 with mesh structure is formed on a sapphire substrate 21. This substrate 23 for epitaxial growth was made similarly to the EXAMPLE 1, except that the r-plane of a sapphire substrate was used as the starting substrate instead of using the C-plane of the sapphire substrate.

On this substrate 23 for epitaxial growth, a n-type GaN base layer 24 having a thickness of 4 μm and a carrier concentration of 1×10$^{18}$, a n-type Al$_{0.07}$Ga$_{0.93}$N cladding layer 25 having a thickness of 1 μm and a carrier concentration of 5×10$^{17}$, an undoped In$_{0.1}$Ga$_{0.9}$N/In$_{0.02}$Ga$_{0.98}$N-3-MQW active layer (a well layer of 4 nm, a barrier layer of 4 nm) 26, and a p-type Al$_{0.07}$Ga$_{0.93}$N cladding layer 27 having a thickness of 0.5 μm and a carrier concentration of 5×10$^{17}$ are sequentially laminated by using the MOVPE method to form a plurality of III group nitride semiconductor epitaxial layers having a LD structure. The product fabricated at this stage is the substrate for a LD. The product fabricated by conducting an ordinary LD device fabricating process such as etching or electrode formation is a LD device 32 shown in FIG. 8. In the drawing, 28 indicates a narrow stripe-shaped waveguide for a semiconductor laser, 29 indicates a Ni/Au Ohmic contact, 30 indicates a Ti/Al Ohmic contact, and 31 indicates a SiO$_2$ film.

The X-ray diffraction analysis of a surface of p-type Al$_{0.07}$Ga$_{0.93}$N cladding layer 27 thus obtained was conducted and it was confirmed that it has an a-plane ((11-20) plane) which was a nonpolar surface at its surface.

Crystallinity of the epitaxial layer was good, and there was no Stark effect, since the LD structure comprises the epitaxial layer having the nonpolar surface, and the LD device having the high emission efficiency could be obtained.

Example 16

In the LD device 32 shown in FIG. 8 explained in the EXAMPLE 15, the metal nitride (TiN) film 22 with mesh structure was formed instead of the metal (Pt) film 22 with mesh structure to fabricate the LD device 32.

The substrate 23 for epitaxial growth, in which the (TiN) film 22 with mesh structure was formed on the sapphire substrate 21, was fabricated by the same process as that in the EXAMPLE 2, except that the r-plane of the sapphire substrate was used as the starting substrate instead of the C-plane of the sapphire substrate. The formation of the epitaxial layer for a LED on the substrate 23 for epitaxial growth was conducted similarly to the EXAMPLE 15.

In this LED device 32, it was also found that there are characteristics and effects similar to those in the EXAMPLE 15.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching herein set forth.

What is claimed is:

1. A method for fabricating a III group nitride semiconductor substrate, comprising the steps of:
   forming a metal film on a starting substrate, the metal film having a first surface contacting the starting substrate, and a second surface on an opposite side of the metal film from the first surface;
   conducting a heat treatment for the starting substrate on which the metal film is formed to form innumerable micro voids which extend from the second surface to the first surface; and
   growing a III group nitride semiconductor crystal via the metal film on the heat treated starting substrate,
   wherein:
      a part of the III group nitride semiconductor crystal is cut out to provide a III group nitride semiconductor self-standing substrate after growing the III group nitride semiconductor crystal to have a thickness of 1 mm or more.

2. A method for fabricating a III group nitride semiconductor substrate, comprising the steps of:
   forming a metal film on a starting substrate;
   conducting a heat treatment for the starting substrate on which the metal film is formed in an atmosphere of gas containing a nitrogen element at a temperature of 800° C. or more to form a metal nitride film, the metal nitride film having a first surface contacting the starting substrate, and a second surface on an opposite side of the metal nitride film from the first surface, by nitriding the metal film and to form innumerable micro voids which extend from the second surface to the first surface; and
   growing a III group nitride semiconductor crystal via the metal nitride film on the heat treated starting substrate,
   wherein:
      a part of the III group nitride semiconductor crystal is cut out to provide a III group nitride semiconductor self-standing substrate after growing the III group nitride semiconductor crystal to have a thickness of 1 mm or more.

* * * * *